(12) United States Patent
Mandal et al.

(10) Patent No.: US 12,721,080 B2
(45) Date of Patent: Aug. 25, 2026

(54) SEMICONDUCTOR CLEANING USING PLASMA-FREE PRECURSORS

(71) Applicant: Applied Materials, Inc., Santa Clara, CA (US)

(72) Inventors: Abhishek Mandal, Thane (IN); Nitin Deepak, Thane (IN); Geetika Bajaj, Mumbai (IN); Ankur Kadam, Thane (IN); Gopi Chandran Ramachandran, Mumbai (IN); Suraj Rengarajan, Bangalore (IN); Farhad K. Moghadam, Saratoga, CA (US); Deenesh Padhi, Sunnyvale, CA (US); Srinivas M. Satya, Cupertino, CA (US); Manish Hemkar, Singapore (SG); Vijay Tripathi, Mumbai (IN); Darshan Thakare, Palghar (IN)

(73) Assignee: Applied Materials, Inc., Santa Clara, CA (US)

( * ) Notice: Subject to any disclaimer, the term of this patent is extended or adjusted under 35 U.S.C. 154(b) by 60 days.

(21) Appl. No.: 17/976,573

(22) Filed: Oct. 28, 2022

(65) Prior Publication Data

US 2024/0145230 A1 May 2, 2024

(51) Int. Cl.
*H10P 70/00* (2026.01)
*H10P 14/60* (2026.01)
*H10P 14/69* (2026.01)

(52) U.S. Cl.
CPC .......... *H10P 70/23* (2026.01); *H10P 14/6326* (2026.01); *H10P 14/6681* (2026.01); *H10P 14/6903* (2026.01)

(58) Field of Classification Search
CPC ........... H01L 21/0206; H01L 21/02123; H01L 21/02208; H01L 21/0226; C23C 16/345; C23C 16/401; C23C 16/4405
See application file for complete search history.

(56) References Cited

U.S. PATENT DOCUMENTS 5,647,953 A * 7/1997 Williams ............ C23C 16/4405 134/1.1
8,076,250 B1 * 12/2011 Rajagopalan ....... H01L 21/0217 257/E21.409
(Continued)

FOREIGN PATENT DOCUMENTS

CN 103026471 A * 4/2013 ............. B05D 3/145
CN 108118312 A * 6/2018 ......... C23C 16/4405
(Continued)

OTHER PUBLICATIONS

Application No. PCT/US2023/077058 , International Search Report and the Written Opinion, Mailed On Jan. 25, 2024, 10 pages.
(Continued)

*Primary Examiner* — Mohammed Shamsuzzaman
(74) *Attorney, Agent, or Firm* — Kilpatrick Townsend & Stockton LLP

(57) ABSTRACT

Exemplary semiconductor processing methods may include providing one or more deposition precursors to a semiconductor processing chamber. A substrate may be disposed within a processing region of the semiconductor processing chamber. The methods may include depositing a silicon-containing material on the substrate and on one or more components of the semiconductor processing chamber. The methods may include providing a fluorine-containing precursor to the processing region. The fluorine-containing precursor may be plasma-free when provided to the processing region. The methods may include contacting the silicon-containing material on the one or more components of the semiconductor processing chamber with the fluorine-containing precursor. The methods may include removing at least a portion of the silicon-containing material on the one or more components of the semiconductor processing chamber with the fluorine-containing precursor.

20 Claims, 2 Drawing Sheets

(56) References Cited

U.S. PATENT DOCUMENTS

| | | | | |
|---|---|---|---|---|
| 9,997,373 | B2 * | 6/2018 | Hudson | H01J 37/32871 |
| 10,156,012 | B2 * | 12/2018 | Kameda | C23C 16/52 |
| 11,685,993 | B2 * | 6/2023 | Morita | B08B 9/032 438/791 |
| 11,786,946 | B2 * | 10/2023 | Son | C23C 16/45561 134/21 |
| 11,965,240 | B2 * | 4/2024 | Nishida | C23C 16/52 |
| 12,077,854 | B2 * | 9/2024 | Pierreux | C23C 16/45561 |
| 2003/0041799 | A1 | 3/2003 | Yang et al. | |
| 2005/0066993 | A1 * | 3/2005 | Hasebe | C23C 16/4404 134/1 |
| 2005/0214455 | A1 * | 9/2005 | Li | C23C 16/4404 427/248.1 |
| 2015/0371866 | A1 * | 12/2015 | Chen | H01L 21/31116 438/715 |
| 2017/0260626 | A1 * | 9/2017 | Nagato | H01L 21/02164 |
| 2018/0057936 | A1 * | 3/2018 | Kameda | C23C 16/402 |
| 2018/0151355 | A1 * | 5/2018 | Fukazawa | H01L 21/02118 |
| 2019/0283093 | A1 | 9/2019 | Son et al. | |

FOREIGN PATENT DOCUMENTS

| | | | | |
|---|---|---|---|---|
| CN | 110402477 A | * | 11/2019 | C23C 16/04 |
| CN | 114207184 A | * | 3/2022 | C23C 16/045 |
| CN | 115053016 A | * | 9/2022 | C23C 16/401 |
| JP | 2003178993 A | * | 6/2003 | H01J 37/32 |
| TW | 202233875 A | | 9/2022 | |
| WO | WO-2014025507 A1 | * | 2/2014 | C23C 16/26 |
| WO | WO-2021067362 A1 | * | 4/2021 | H01J 37/32 |

OTHER PUBLICATIONS

Office Action for Taiwan Appln No. 112140964 dated Jul. 18, 2024, 17 pages.

PCT/US2023/077058, "International Preliminary Report on Patentability", May 8, 2025, 7 pages.

TW112140964, "Office Action", Apr. 15, 2025, 15 pages.

Taiwanese Application No. 112140964, Office Action mailed on Sep. 5, 2025, 5 pages.

* cited by examiner

SEMICONDUCTOR CLEANING USING PLASMA-FREE PRECURSORS

TECHNICAL FIELD

The present technology relates to semiconductor cleaning operations. More specifically, the present technology relates to methods of cleaning semiconductor surfaces or components.

BACKGROUND

Integrated circuits are made possible by processes which produce intricately patterned material layers on substrate surfaces. Producing patterned material on a substrate requires controlled methods of formation and removal of exposed material. After deposition processes have been performed within a chamber, chamber components may include residual materials from the deposition process. Chamber cleaning operations may remove residues from the chamber, however the process may erode chamber components over time.

Thus, there is a need for improved systems and methods that can be used to produce high quality devices and structures. These and other needs are addressed by the present technology.

SUMMARY

Exemplary semiconductor processing methods may include providing one or more deposition precursors to a semiconductor processing chamber. A substrate may be disposed within a processing region of the semiconductor processing chamber. The methods may include depositing a silicon-containing material on the substrate and on one or more components of the semiconductor processing chamber. The methods may include providing a fluorine-containing precursor to the processing region. The fluorine-containing precursor may be plasma-free when provided to the processing region. The methods may include contacting the silicon-containing material on the one or more components of the semiconductor processing chamber with the fluorine-containing precursor. The methods may include removing at least a portion of the silicon-containing material on the one or more components of the semiconductor processing chamber with the fluorine-containing precursor.

In some embodiments, the one or more deposition precursors comprise a silicon-containing precursor. The silicon-containing material may be a silicon-and-oxygen-containing material or a silicon-and-nitrogen-containing material. The fluorine-containing precursor may be or include hydrofluoric acid (HF), ammonium fluoride ($NH_4F$), ammonium bifluoride ($NH_4HF_2$), HF-pyridine, tetrafluorohydrazine ($N_2F_4$), tetramehtylammonium fluoride ($(CH_3)_4NF$), tetra-n-butylammonium fluoride ($(C_4H_9)_4NF$), $N_2H_5F$, $N_2H_5F_2$, or hydrazinium fluorides. The methods may include providing a co-reactant to the processing region with the fluorine-containing precursor. The co-reactant may weaken bonds in the fluorine-containing precursor. The co-reactant may be or include water or steam ($H_2O$), an alcohol, a glycol, ammonia ($NH_3$), an amine, trifluoro acetic acid, hydrogen, helium, or argon. The methods may include generating a fluorine-containing plasma from the fluorine-containing precursor in the processing region. The methods may include providing an activation precursor to the processing region with the fluorine-containing precursor. The methods may include contacting the silicon-containing material deposited on the one or more components of the semiconductor processing chamber with the activation precursor. The activation precursor may weaken bonds in the silicon-containing material. The activation precursor may be or include water or steam ($H_2O$), an alcohol, a glycol, ammonia ($NH_3$), an amine, trifluoro acetic acid, hydrogen, helium, or argon. A temperature within the semiconductor processing chamber may be maintained at less than or about 700° C. A pressure within the semiconductor processing chamber may be maintained at less than or about 10 Torr.

Some embodiments of the present disclosure encompass semiconductor processing methods. The methods may include i) providing one or more deposition precursors to a semiconductor processing chamber. A substrate may be disposed within a processing region of the semiconductor processing chamber; The methods may include ii) depositing a silicon-containing material on the substrate and on one or more components of the semiconductor processing chamber. The methods may include iii) providing a fluorine-containing precursor and a co-reactant to the processing region. The co-reactant may weaken bonds in the fluorine-containing precursor. The methods may include iv) contacting the silicon-containing material on the one or more components of the semiconductor processing chamber with the fluorine-containing precursor. The methods may include v) removing at least a portion of the silicon-containing material on the one or more components of the semiconductor processing chamber with the fluorine-containing precursor. The methods may include vi) repeating operations i) through v) for at least three cycles.

In some embodiments, the substrate is disposed on a substrate support within the processing region. The fluorine-containing precursor may be provided to the processing region below the substrate support. The methods may include providing one or more of water or steam ($H_2O$), an alcohol, a glycol, ammonia ($NH_3$), an amine, or trifluoro acetic acid with the fluorine-containing precursor at operation iii). The methods may include providing one or more of hydrogen, helium, or argon with the fluorine-containing precursor at operation iii). The fluorine-containing precursor may be free of ammonia ($NH_3$). A temperature within the semiconductor processing chamber may be maintained at between about 150° C. and about 650° C.

Some embodiments of the present disclosure encompass semiconductor processing methods. The methods may include providing a silicon-containing precursor to a semiconductor processing chamber. A substrate may be disposed within a processing region of the semiconductor processing chamber. The methods may include depositing a silicon-containing material on the substrate and on one or more components of the semiconductor processing chamber. The silicon-containing material may include a silicon-and-oxygen-containing material or a silicon-and-nitrogen-containing material. The methods may include activating the silicon-containing material. The activating may weaken bonds in the silicon-containing material. The methods may include providing a fluorine-containing precursor to the processing region. The methods may include contacting the silicon-containing material on the one or more components of the semiconductor processing chamber with the fluorine-containing precursor. The methods may include removing at least a portion of the silicon-containing material with the fluorine-containing precursor.

In some embodiments, depositing the silicon-containing material and removing the portion of silicon-containing material may be performed simultaneously. The fluorine-containing precursor provided to the processing region may be maintained plasma-free.

Such technology may provide numerous benefits over conventional systems and techniques. For example, the processes may produce a chamber coating able to be maintained for hundreds of wafer cycles or more. Additionally, the operations of embodiments of the present technology may overcome reductions in removal rates over time, while protecting chamber components from erosion. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
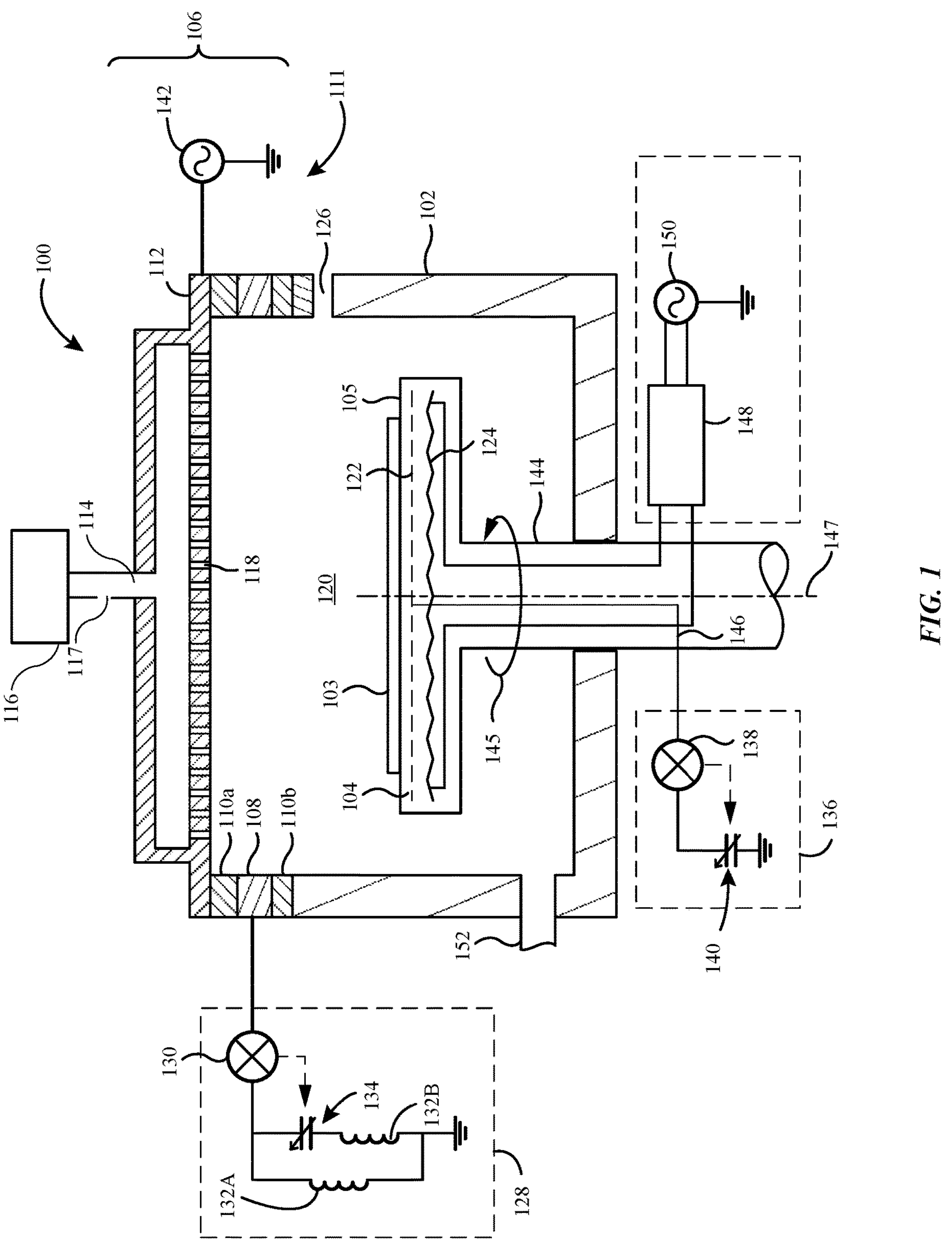
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Deposition operations in semiconductor processing may be included to form any number of materials on a substrate. For example, materials may be deposited on a substrate to produce semiconductor structures, as well as to facilitate patterning or removal of materials on a substrate. As one non-limiting example, deposition operations may include forming a silicon-containing material on a substrate. The silicon-containing material deposition may be performed in any number of ways, including by thermally-activated deposition as well as plasma-enhanced deposition. Regardless of the mechanism, many deposition operations deposit materials not only on the substrate being processed, but on one or more chamber components as well. For example, in a processing region, deposition may occur on a substrate as well as a pedestal or support on which the substrate is seated, faceplates, or diffusers that may distribute materials into the processing region, chamber walls defining the processing region, and components defining exhaust pathways for materials and byproducts subsequent deposition.

Once the deposition process is completed, the substrate may be removed from the processing region, and a cleaning operations may be employed. Chamber cleaning may form a plasma of one or more precursors that may etch or otherwise remove residual materials formed on the chamber components in order to essentially reset the chamber prior to a subsequent processing operation, which may help maintain consistency wafer-to-wafer. However, these chamber cleaning operations may produce a number of challenges. For example, an remotely formed plasma, such as a plasma generated in remote plasma source unit, may be readily controlled to ensure more thorough cleaning may be performed, and cleaning materials may reach the various architectural geometries of the processing region. However, a remotely formed plasma may be time consuming, may require the use of expensive equipment and materials, and may generate greenhouse gases that must be treated prior to being exhausted.

The present technology may overcome these limitations by performing cleaning operations that do not include the generation of a remote plasma. Instead, the present technology may provide cleaning precursors that are plasma-free or in a non-plasma state. The present technology also may encompass providing additional precursors, such as activation precursors or co-reactants, during the cleaning operations. The additional precursors may treat or activate the silicon-containing material or the cleaning precursors to modify chemical structure and afford easier cleaning and removal of silicon-containing materials.

Although the remaining disclosure will routinely identify specific cleaning operations utilizing the disclosed technology, it will be readily understood that the systems and methods are equally applicable to other chambers, as well as processes as may occur in the described chambers. Accordingly, the technology should not be considered to be so limited as for use with these specific deposition processes or chambers alone. The disclosure will discuss one possible system and chamber that may be used to perform cleaning operations according to embodiments of the present technology before additional details according to embodiments of the present technology are described.

FIG. 1 shows a cross-sectional view of an exemplary processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110*a*, 110*b*, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Inlet 114 may include delivery from a remote plasma source unit 116, which may be fluidly coupled with the chamber, as well as a bypass 117 for process gas delivery that may not flow through the remote plasma source unit 116 in some embodiments. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
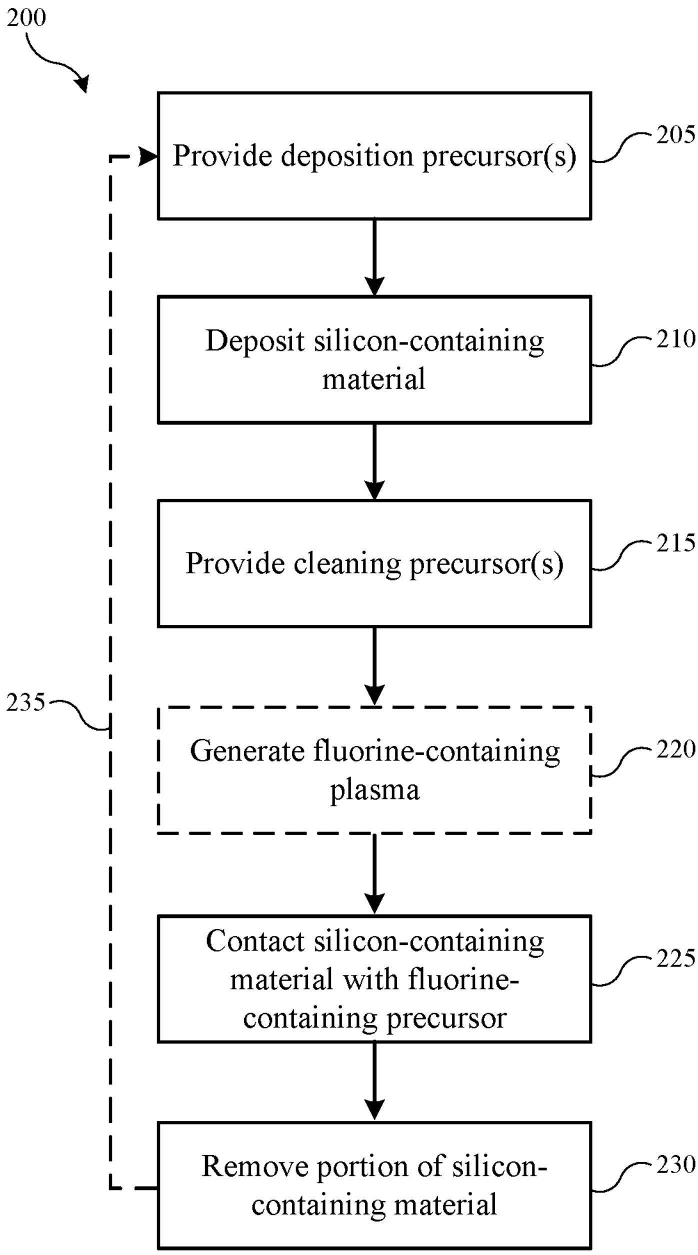
FIG. 2 shows exemplary operations in a deposition method according to some embodiments of the present technology.

FIG. 2 shows exemplary operations in a method 200 of treating a chamber according to some embodiments of the present technology. The method may be performed in a variety of processing chambers, including processing chamber 100 described above. Method 200 may include one or more operations prior to the initiation of the method, including front end processing, polishing, cleaning, deposition, etching, or any other operations that may be performed prior to the described operations. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as will be discussed further below.

At operation 205, method 200 may include providing one or more deposition precursors to a semiconductor processing chamber. A substrate may be disposed within a processing region of the semiconductor processing chamber. The one or more deposition precursors may be provided through a gas distributor, such as gas distributor 112, defining apertures, such as apertures 118, for distributing process precursors into the processing region or processing volume. The one or more deposition precursors may include a silicon-containing precursor. The silicon-containing precursor may include organosilanes, which may include silane, disilane, and other materials. Additional silicon-containing precursors may include silicon, carbon, oxygen, or nitrogen, such as trisilylamine. Additional deposition precursors may include oxygen-containing precursors, nitrogen-containing precursors, or any other semiconductor precursors used to form silicon-containing material. The one or more deposition precursors may or may not include delivery of additional precursors, such as carrier gases or one or more dopant precursors for depositing a doped silicon-containing material.

At operation 210, method 200 may include depositing a silicon-containing material on the substrate. During method 200, the silicon-containing material may also deposit on one or more components of the semiconductor processing chamber. For example, the silicon-containing material may deposit on the chamber body or components within the processing region, such as on the substrate support, below the substrate support, proximate the outlet of the chamber, or around/on any other component. Depending on the deposition precursors provided to the semiconductor processing chamber at operation 205, various silicon-containing materials may be deposited. For example, if the deposition precursors include silicon and oxygen, a silicon-and-oxygen-containing material may be deposited. Alternatively, if the deposition precursors include silicon and nitrogen, a silicon-and-nitrogen-containing material may be deposited. It is contemplated that the deposition precursors may include any number of constituents.

The deposition of silicon-containing material at operation 210 may be formed at a variety of temperatures and processes. Depending on the material to be formed, the process conditions may be modified to depositing silicon-containing material, such as silicon-and-oxygen-containing material or silicon-and-nitrogen-containing material. During operation 210, a plasma power may be provided to generate plasma effluents of the one or more deposition precursors. The application of plasma power may increase a deposition rate of the silicon-containing material and/or may increase conformality of a material being deposited.

At operation 215, method 200 may include providing one or more cleaning precursors to the semiconductor processing chamber. The one or more cleaning precursors may include a fluorine-containing precursor. The fluorine-containing precursor may include one or more fluorine-containing materials such as a fluorocarbon, atomic fluorine (F), diatomic fluorine ($F_2$), an interhalogen fluoride, such as bromine trifluoride ($BF_3$) or chlorine trifluoride ($ClF_3$), nitrogen trifluoride ($NF_3$), sulfur hexafluoride ($SF_3$), or xenon difluoride ($XF_2$). In embodiments, the fluorine-containing precursor may include hydrogen and may be, for example, hydrofluoric acid (HF), ammonium fluoride ($NH_4F$), ammonium bifluoride ($NH_4HF_2$), HF-pyridine, tetrafluorohydrazine ($N_2F_4$), tetramehtylammonium fluoride ($(CH_3)_4NF$), tetra-n-butylammonium fluoride ($(C_4H_9)_4NF$), $N_2H_5F$, $N_2H_5F_2$, or hydrazinium fluorides. In some embodiments, the fluorine-containing precursor may be free of $NH_3$, which may lead to the formation of greenhouse gases and increased operation costs.

As previously described, the one or more deposition precursors may be provided through a gas distributor defining apertures for distributing process precursors into the processing region or processing volume. Any of the one or more cleaning precursors may be provided through a bottom of the chamber. For example, in embodiments, the one or more cleaning precursors may be provided from an opening in the chamber below the substrate support, such as substrate support 104. By providing the one or more cleaning precursors below the substrate support, cleaning of the chamber may be focused on areas below the substrate support, such as where undesirable buildup may occur. Additionally, by providing the one or more cleaning precursors below the substrate support, interaction between the silicon-containing material being deposited on the substrate and the one or more cleaning precursors may be minimized. In embodiments, the one or more cleaning precursors, such as the fluorine-containing precursor, may be provided plasma-free to the processing region. By providing the cleaning precursors plasma-free, additional plasma generation steps, such as in a remote plasma source unit, may not be necessary, thereby reducing complexity of the method 200. Additionally, the formation of a remote plasma of the one or more cleaning precursors may result in the release of greenhouse gases. Moreover, the operation of the remote plasma source unit may be expensive and unreliable.

At operation 215, method 200 may also include providing an activation precursor or a co-reactant. It is also contemplated that the activation precursor or co-reactant may be provided with and/or prior to the one or more cleaning precursors. For example, activation precursor may be provided prior to the one or more cleaning precursors and the co-reactant may be provided with the fluorine-containing precursor. Like the one or more cleaning precursors, the activation precursor and/or the co-reactant may be provided from an opening in the chamber below the substrate support.

The activation precursor may be provided to treat the silicon-containing material deposited on the one or more components of the semiconductor processing chamber prior to treating the silicon-containing material with the fluorine-containing precursor. The activation precursor may interact with the silicon-containing material and may weaken bonds in the silicon-containing material. For example, in the case of a silicon-and-oxygen-containing material, the activation precursor may weaken Si—O bonds in the silicon-containing material. With weakened Si—O bonds, the one or more cleaning precursors, such as the fluorine-containing precursor, may more easily remove the silicon-containing material deposited on the chamber and chamber components. Some activation precursors may activate the silicon-containing material to be shift the electro-positive center to the central Si atom, allowing for easier nucleophilic attack and removal of the silicon-containing material. In embodiments, the activation precursor may be or include water or steam ($H_2O$), an alcohol (e.g., methanol, isopropyl alcohol, butanol, etc.), a glycol (e.g., dimethyl glycol), ammonia ($NH_3$), a primary, secondary, or tertiary amine, trifluoro acetic acid, or combinations thereof. The activation precursor may additionally or alternatively include plasma effluents of hydrogen, nitrogen, oxygen, fluorine, argon, or combinations thereof. In some embodiments, an energy source, such as microwave energy, IR energy, UV energy, laser energy, or combinations thereof may be provided to activate the silicon-containing material.

In addition to the activation precursor enhancing the kinetics of removing the silicon-containing material, the weakened silicon-containing material may direct/pull the one or more cleaning precursors toward the weakened silicon-containing material, thereby increasing selectivity and efficiency of the removal, such as selectivity to silicon-containing material deposited on the one or more chamber components and, for example, aluminum or other metal chamber components.

The co-reactant may be provided to modify the one or more cleaning precursors, such as the fluorine-containing precursor. The co-reactant may interact with the one or more cleaning precursors and may weaken bonds in the cleaning precursors. For example, in the case of a fluorine-containing precursor, the co-reactant may weaken fluorine bonds in the fluorine-containing precursor. With weakened fluorine bonds, the bonds may break easier compared to non-modified fluorine bonds, which may more easily allow the silicon-containing material to be removed by fluorine. In addition to weakening the fluorine bonds, which may enhance polarization of the fluorine-containing precursor, the co-reactant may energize the one or more cleaning precursors, such as through external ionization, again more easily allowing the silicon-containing material to be removed by one or more cleaning precursors. In embodiments, the co-reactant may be or include water or steam ($H_2O$), an alcohol (e.g., methanol, isopropyl alcohol, butanol, etc.), a glycol (e.g., dimethyl glycol), ammonia ($NH_3$), a primary, secondary, or tertiary amine, trifluoro acetic acid, or combinations thereof. The co-reactant may additionally or alternatively include plasma effluents of hydrogen, nitrogen, oxygen, fluorine, argon, or combinations thereof. In some embodiments, an energy source, such as microwave energy, IR energy, UV energy, laser energy, or combinations thereof may be provided to activate the one or more deposition precursors.

At optional operation 220, method 200 may include generating a plasma from the cleaning precursors in the processing region. For example, when the one or more cleaning precursors include a fluorine-containing precursor, operation 220 may include generating a fluorine-containing plasma from the fluorine-containing precursor in the processing region. The plasma effluents of the fluorine-containing precursor, or other cleaning precursor(s), may be generated by applying an RF power to the processing region. Alternatively or additionally, the fluorine-containing precursor may contact excited species being purged from the processing region, which may in turn excite the one or more cleaning precursors thereby generating a plasma from the cleaning precursors in the processing region.

At operation 225, method 200 may include contacting the silicon-containing material on the one or more components of the semiconductor processing chamber with the one or more cleaning precursors or the plasma effluents thereof. At operation 225, method 200 may include removing at least a portion of the silicon-containing material on the one or more components of the semiconductor processing chamber with the one or more cleaning precursors, such as the fluorine-containing precursor. The one or more cleaning precursors may interact with the silicon-containing material to volatize the silicon-containing material. For example, the fluorine-containing precursor may interact with the silicon-containing material to yield silicon tetrafluoride (SiF4) and oxygen or nitrogen gaseous byproduct. The volatiles may then be purged from the chamber to remove the silicon-containing material from the chamber and/or chamber components. The silicon-containing material removed may not include or may be selective to silicon-containing material formed on the substrate. As previously discussed, the delivery of the one or more cleaning precursors may minimize interaction with silicon-containing material deposited on the substrate. In some embodiments, the substrate may even be removed prior to the one or more cleaning precursors being provided to the processing region.

As shown in FIG. 2, method 200 may include repeating operations 205-230 for a number of cycles at operation 235. By repeating operations 205-230, a buildup of the silicon-containing material on one or more components of the semiconductor processing chamber may be reduced. In embodiments, the operations of method 200 may be repeated for at least two cycles, at least three cycles, at least four cycles, at least five cycles, at least ten cycles, at least fifteen cycles, at least twenty cycles, at least thirty cycles, at least forty cycles, at least fifty cycles, or more. In other embodiments, the operations of method 200 may be continuously repeated as different substrates are positioned within the processing region for the deposition of silicon-material.

In embodiments, the deposition operations and cleaning operations may be performed simultaneously. Specifically, depositing the silicon-containing material and removing the portion of silicon-containing material may be performed simultaneously. As previously discussed, by providing the one or more cleaning precursors to the processing region in a different region than the one or more deposition precursors, deposition may continue without interference by the one or more cleaning precursors.

Process conditions may impact the operations performed in method 200. Each of the operations of method 200 may be performed during a constant temperature in embodiments, while in some embodiments the temperature may be adjusted during different operations. In some embodiments of the present technology, method 200 may be performed at substrate, pedestal, and/or chamber temperatures less or about 700° C., and may be performed at temperatures less than or about 650° C., less than or about 600° C., less than or about 550° C., less than or about 500° C., less than or about 450° C., less or about 400° C., less or about 350° C., less or about 300° C., less or about 250° C., less or about 200° C., less or about 150° C., or lower. The temperature may also be maintained at any temperature within these ranges, within smaller ranges encompassed by these ranges, or between any of these ranges. In embodiments, the temperature may be maintained at a temperature at which silicon-containing material may be deposited, reducing downtime and increasing throughput. Accordingly, in some embodiments, the pressure may be maintained between about 150° C. and about 650° C.

The pressure within the semiconductor processing chamber may also affect the operations performed. In embodiments, the pressure may be maintained at less than about 20 Torr. Accordingly, the pressure may be maintained at less than or about 15 Torr, less than or about 14 Torr, less than or about 13 Torr, less than or about 12 Torr, less than or about 11 Torr, less than or about 10 Torr, less than or about 9 Torr, less than or about 8 Torr, less than or about 7 Torr, less than or about 6 Torr, less than or about 5 Torr, less than or about 4 Torr, less than or about 3 Torr, less than or about 2 Torr, less than or about 1 Torr, or less. The pressure may also be maintained at any pressure within these ranges, within smaller ranges encompassed by these ranges, or between any of these ranges. Conventional technologies may require higher temperatures to activate the removal of silicon-containing material. However, lower operating pressures may be afforded due to the activation of the one or more deposition precursors and/or the activation of the silicon-containing material. Accordingly, in some embodiments, the pressure may be maintained between about 1 Torr and about 10 Torr.

Conventional technologies may use plasma effluents of cleaning precursors, such as fluorine-containing precursors, formed remote from the processing region. As previously discussed, the use of remote plasma source units may be time consuming and produce greenhouse gases. Additionally, remote plasma source units may be expensive, unreliable, and allow for only sequential deposition and cleaning. Plasma-less cleaning operations have process limitations, such as slow kinetics, limited process regimes (e.g., temperatures), and may require extremely reactive chemistry. The present embodiments may overcome challenges associated with conventional technologies by utilizing a plasma-free cleaning chemistry that allows for efficient cleaning at a variety of temperatures. The present embodiments, as described, do not require the use of remote plasma source units and, therefore, may increase throughput and maintain the lifetime of chambers and chamber components.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the material" includes reference to one or more materials and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:

i) providing one or more deposition precursors to a semiconductor processing chamber, wherein a substrate is disposed within a processing region of the semiconductor processing chamber;

ii) depositing a silicon-containing material on the substrate and on one or more components of the semiconductor processing chamber;

iii) providing an activation precursor to the processing region;

iv) providing a fluorine-containing precursor to the processing region, wherein the fluorine-containing precursor is plasma-free when provided to the processing region;

v) contacting the silicon-containing material on the one or more components of the semiconductor processing chamber with the fluorine-containing precursor;

vi) removing at least a portion of the silicon-containing material on the one or more components of the semiconductor processing chamber with the fluorine-containing precursor; and vii) repeating operations i) through vi) for a number of cycles, wherein a pressure within the semiconductor processing chamber during the semiconductor processing method is maintained at less than or about 20 Torr.

2. The semiconductor processing method of claim 1, wherein the one or more deposition precursors comprise a silicon-containing precursor.

3. The semiconductor processing method of claim 1, wherein the silicon-containing material comprises a silicon-and-oxygen-containing material or a silicon-and-nitrogen-containing material.

4. The semiconductor processing method of claim 1, wherein the fluorine-containing precursor comprises hydrofluoric acid (HF), ammonium fluoride ($NH_4F$), ammonium bifluoride ($NH_4HF_2$), HF-pyridine, tetrafluorohydrazine ($N_2F_4$), tetramehtylammonium fluoride ($(CH_3)_4NF$), tetra-n-butylammonium fluoride ($(C_4H_9)_4NF$), $N_2H_5F$, $N_2H_5F_2$, or hydrazinium fluorides.

5. The semiconductor processing method of claim 1, further comprising:
   providing a co-reactant to the processing region with the fluorine-containing precursor, wherein the co-reactant weakens bonds in the fluorine-containing precursor.

6. The semiconductor processing method of claim 5, wherein the co-reactant comprises water or steam ($H_2O$), an alcohol, a glycol, ammonia ($NH_3$), an amine, trifluoro acetic acid, hydrogen, helium, or argon.

7. The semiconductor processing method of claim 1, further comprising:
   generating a fluorine-containing plasma from the fluorine-containing precursor in the processing region.

8. The semiconductor processing method of claim 1, further comprising:
   contacting the silicon-containing material deposited on the one or more components of the semiconductor processing chamber with the activation precursor, wherein the activation precursor weakens bonds in the silicon-containing material.

9. The semiconductor processing method of claim 8, wherein the activation precursor comprises water or steam ($H_2O$), an alcohol, a glycol, ammonia ($NH_3$), an amine, trifluoro acetic acid, hydrogen, helium, or argon.

10. The semiconductor processing method of claim 1, wherein a temperature within the semiconductor processing chamber is maintained at less than or about 700° C.

11. The semiconductor processing method of claim 1, wherein a pressure within the semiconductor processing chamber is maintained at less than or about 10 Torr.

12. A semiconductor processing method comprising:
   i) providing one or more deposition precursors to a semiconductor processing chamber, wherein a substrate is disposed within a processing region of the semiconductor processing chamber;
   ii) depositing a silicon-containing material on the substrate and on one or more components of the semiconductor processing chamber;
   iii) providing an activation precursor to the processing region;
   iv) providing a fluorine-containing precursor and a co-reactant to the processing region, wherein the co-reactant weakens bonds in the fluorine-containing precursor;
   v) contacting the silicon-containing material on the one or more components of the semiconductor processing chamber with the fluorine-containing precursor;
   vi) removing at least a portion of the silicon-containing material on the one or more components of the semiconductor processing chamber with the fluorine-containing precursor; and
   vii) repeating operations i) through vi) for at least three cycles, wherein:
      a temperature within the semiconductor processing chamber is maintained at less than or about 700° C.; and
      a pressure within the semiconductor processing chamber during the semiconductor processing method is maintained at less than or about 20 Torr.

13. The semiconductor processing method of claim 12, wherein:
   the substrate is disposed on a substrate support within the processing region; and
   the fluorine-containing precursor is provided to the processing region below the substrate support.

14. The semiconductor processing method of claim 12, further comprising:
   providing one or more of water or steam ($H_2O$), an alcohol, a glycol, ammonia ($NH_3$), an amine, or trifluoro acetic acid with the fluorine-containing precursor at operation iii).

15. The semiconductor processing method of claim 12, further comprising:
   providing one or more of hydrogen, helium, or argon with the fluorine-containing precursor at operation iii).

16. The semiconductor processing method of claim 12, wherein the fluorine-containing precursor is free of ammonia ($NH_3$).

17. The semiconductor processing method of claim 12, wherein a temperature within the semiconductor processing chamber is maintained at between about 150° C. and about 650° C.

18. A semiconductor processing method comprising:
   i) providing a silicon-containing precursor to a semiconductor processing chamber, wherein a substrate is disposed within a processing region of the semiconductor processing chamber;
   ii) depositing a silicon-containing material on the substrate and on one or more components of the semiconductor processing chamber, wherein the silicon-containing material comprises a silicon-and-oxygen-containing material or a silicon-and-nitrogen-containing material;
   iii) activating the silicon-containing material, wherein the activating weakens bonds in the silicon-containing material;
   iv) providing a fluorine-containing precursor to the processing region;
   v) contacting the silicon-containing material on the one or more components of the semiconductor processing chamber with the fluorine-containing precursor;
   vi) removing at least a portion of the silicon-containing material with the fluorine-containing precursor; and
   vii) repeating operations i) through vi) for a number of cycles, wherein:
      a temperature within the semiconductor processing chamber is maintained at less than or about 700° C.; and
      a pressure within the semiconductor processing chamber during the semiconductor processing method is maintained at less than or about 20 Torr.

19. The semiconductor processing method of claim 18, wherein depositing the silicon-containing material and removing the portion of silicon-containing material are performed simultaneously.

20. The semiconductor processing method of claim 18, wherein the fluorine-containing precursor provided to the processing region is maintained plasma-free.

* * * * *